United States Patent
Kwak

(10) Patent No.: US 10,627,088 B2
(45) Date of Patent: Apr. 21, 2020

(54) LIGHT SOURCE MODULE AND LIGHTING DEVICE

(71) Applicant: LG INNOTEK CO., LTD., Seoul (KR)

(72) Inventor: Jae O Kwak, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 175 days.

(21) Appl. No.: 15/544,436

(22) PCT Filed: Jan. 19, 2016

(86) PCT No.: PCT/KR2016/000548
§ 371 (c)(1),
(2) Date: Jul. 18, 2017

(87) PCT Pub. No.: WO2016/117905
PCT Pub. Date: Jul. 28, 2016

(65) Prior Publication Data
US 2017/0350579 A1    Dec. 7, 2017

(30) Foreign Application Priority Data

Jan. 19, 2015 (KR) .................. 10-2015-0008707
Jan. 22, 2015 (KR) .................. 10-2015-0010571
Apr. 8, 2015 (KR) .................. 10-2015-0049710

(51) Int. Cl.
*F21V 23/00* (2015.01)
*F21V 15/01* (2006.01)
(Continued)

(52) U.S. Cl.
CPC .............. *F21V 23/005* (2013.01); *F21S 4/28* (2016.01); *F21V 5/008* (2013.01); *F21V 5/04* (2013.01);
(Continued)

(58) Field of Classification Search
CPC ........ F21V 23/005; F21V 23/001; F21V 5/04; H01L 27/156; H05B 33/0815
(Continued)

(56) References Cited

U.S. PATENT DOCUMENTS

2005/0112801 A1* 5/2005 Russell .............. H05B 33/0815
                                                        438/116
2007/0047229 A1    3/2007 Lee
(Continued)

FOREIGN PATENT DOCUMENTS

JP    2009-193960 A    8/2009
JP    2011-138715 A    7/2011
(Continued)

OTHER PUBLICATIONS

International Search Report, issued in PCT/KR2016/000548, dated May 27, 2016.

*Primary Examiner* — Bo Fan
(74) *Attorney, Agent, or Firm* — Birch, Stewart, Kolasch & Birch, LLP

(57) ABSTRACT

A light source module according to an embodiment includes a substrate, a plurality of light emitting device packages disposed on the substrate, a plurality of driving devices disposed on the substrate, and a connection terminal part disposed on the substrate, wherein an interval between both ends of the substrate and the connection terminal part is equal to or greater than an interval between the light emitting device package adjacent to the both ends of the substrate and the both ends of the substrate. The light source module is advantageous to slimming and thinning and has an advantage where a design of arrangement of a light emitting device package is free.

14 Claims, 14 Drawing Sheets

(51) Int. Cl.
*F21V 5/00* (2018.01)
*H01L 25/16* (2006.01)
*F21S 4/28* (2016.01)
*F21V 5/04* (2006.01)
*H01L 27/15* (2006.01)
*H05B 45/00* (2020.01)
*H05B 45/37* (2020.01)
*F21Y 115/10* (2016.01)
*H01L 33/62* (2010.01)

(52) U.S. Cl.
CPC ............ *F21V 15/01* (2013.01); *F21V 23/001* (2013.01); *H01L 25/167* (2013.01); *H01L 27/156* (2013.01); *F21Y 2115/10* (2016.08); *H01L 33/62* (2013.01); *H01L 2224/48091* (2013.01); *H05B 45/00* (2020.01); *H05B 45/37* (2020.01)

(58) Field of Classification Search
USPC .......................................................... 257/99
See application file for complete search history.

(56) References Cited

U.S. PATENT DOCUMENTS

| | | | |
|---|---|---|---|
| 2009/0080184 A1* | 3/2009 | Kobilke | H01L 25/0753 362/227 |
| 2009/0207125 A1 | 8/2009 | Park et al. | |
| 2010/0194271 A1 | 8/2010 | Tomiyoshi | |
| 2011/0133224 A1 | 6/2011 | Zoorob et al. | |
| 2012/0256548 A1 | 10/2012 | Collins et al. | |
| 2013/0027905 A1* | 1/2013 | Lee | F21K 9/00 362/84 |

FOREIGN PATENT DOCUMENTS

| | | |
|---|---|---|
| JP | 2013-152804 A | 8/2013 |
| JP | 2013-206670 A | 10/2013 |
| JP | 2014-72149 A | 4/2014 |
| KR | 10-2014-0063922 A | 5/2014 |
| WO | WO 2009/016852 A1 | 2/2009 |

\* cited by examiner

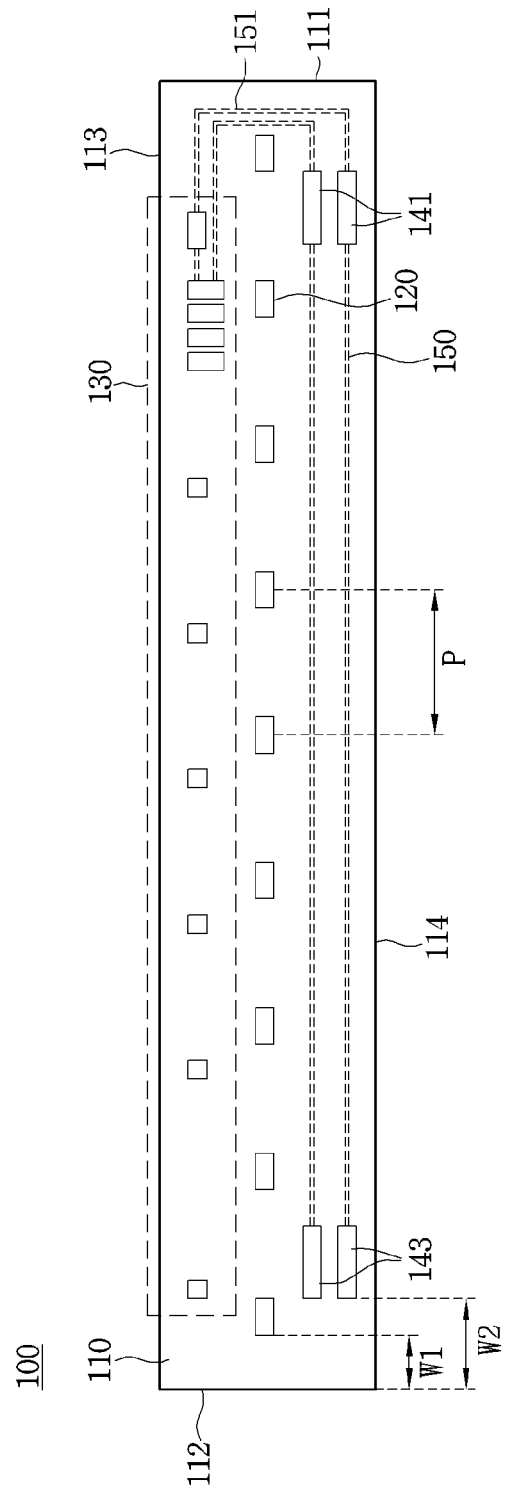
[Figure 1]

[Figure 2]
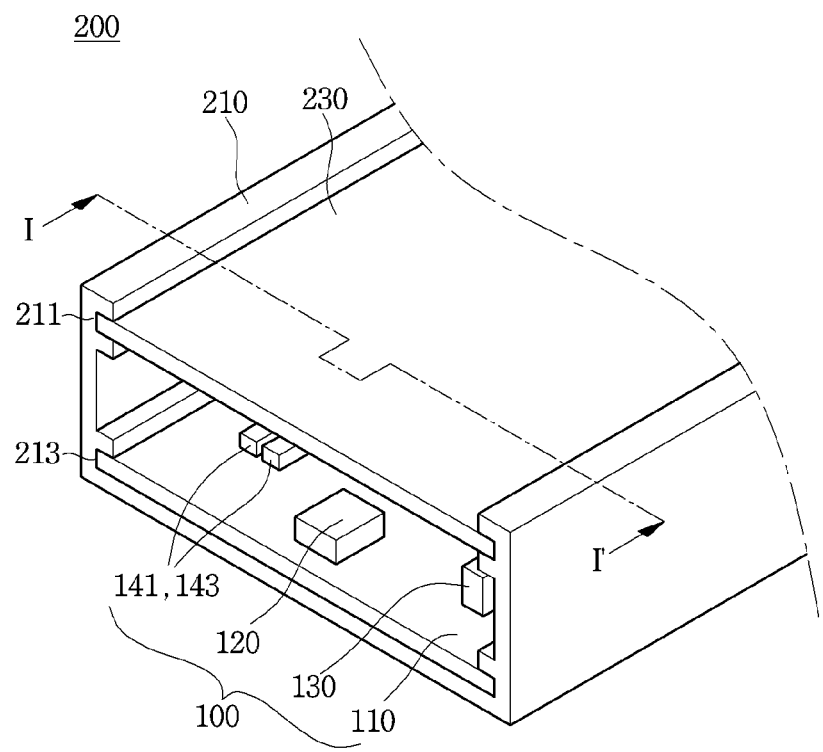
[Figure 3]
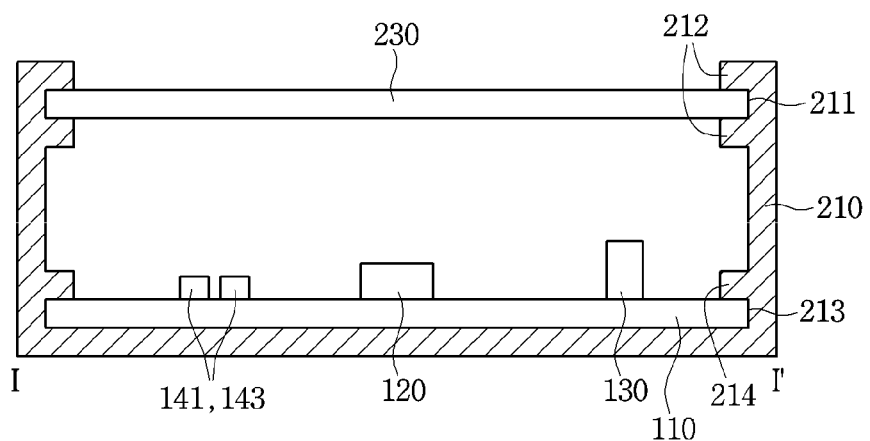

[Figure 4]
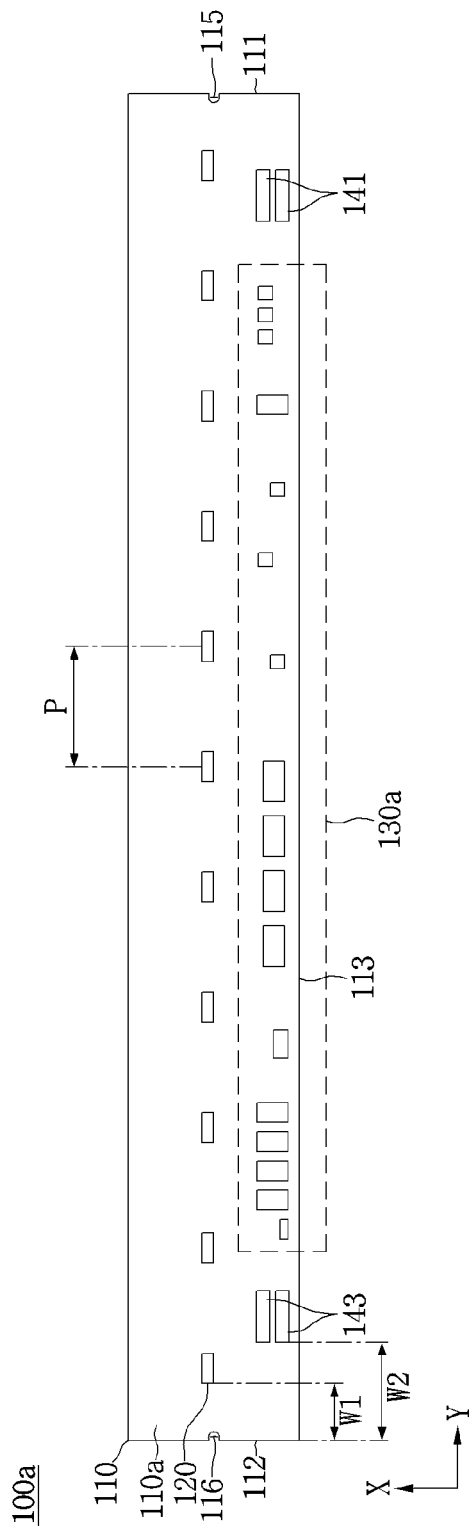

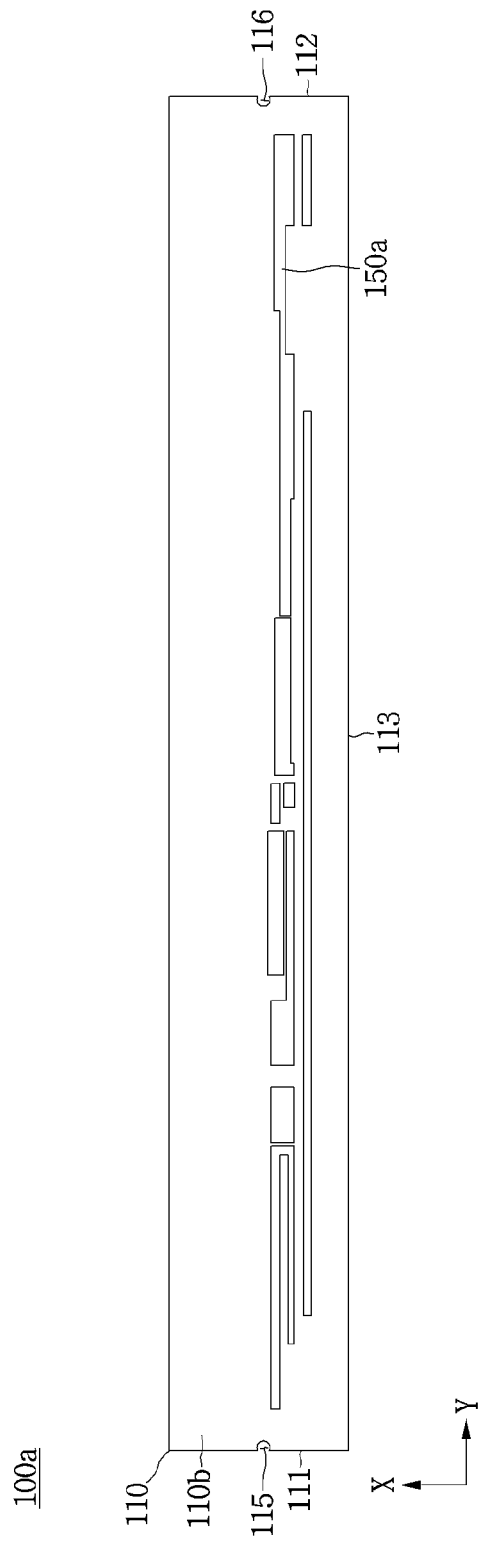

【Figure 6】
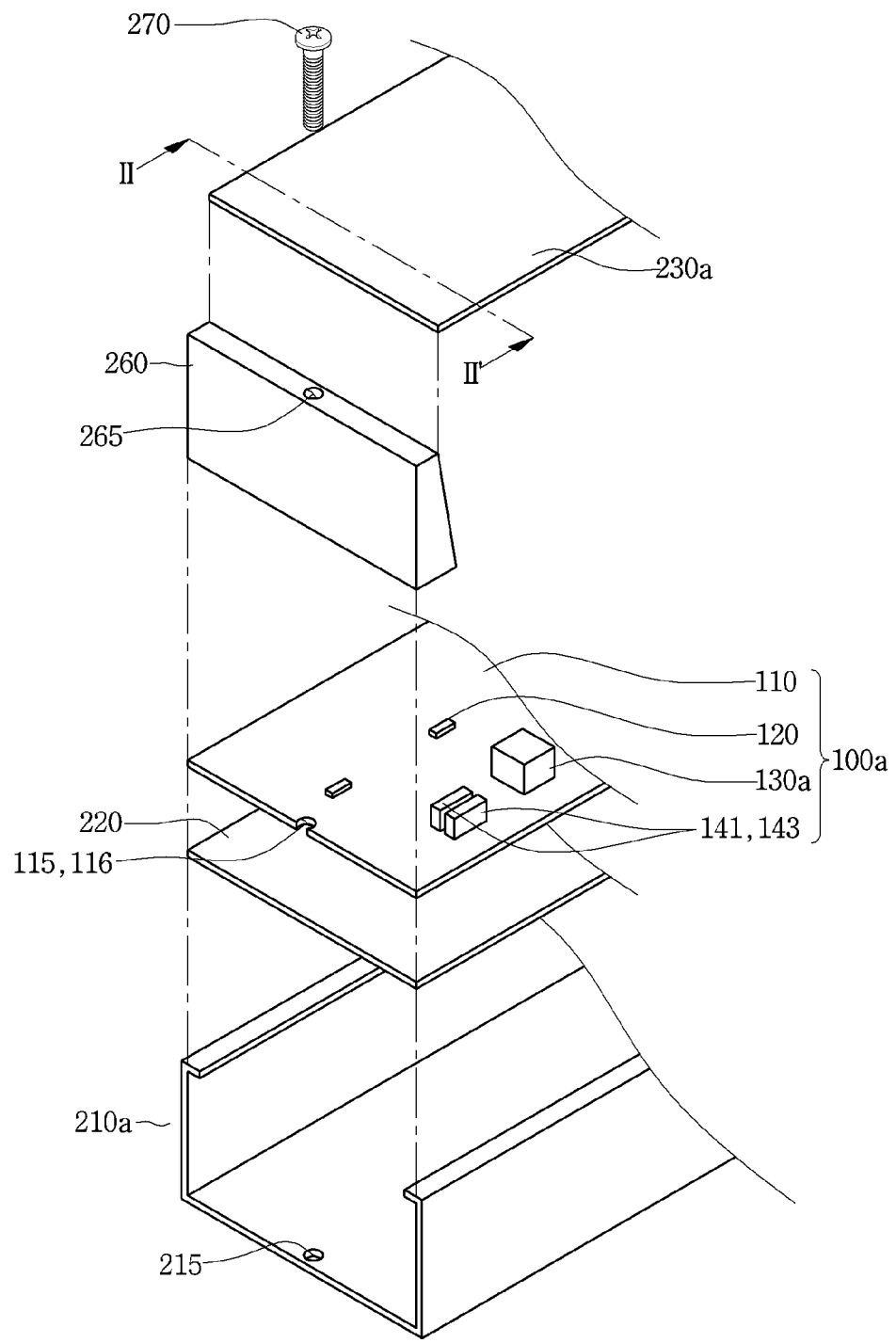

【Figure 7】
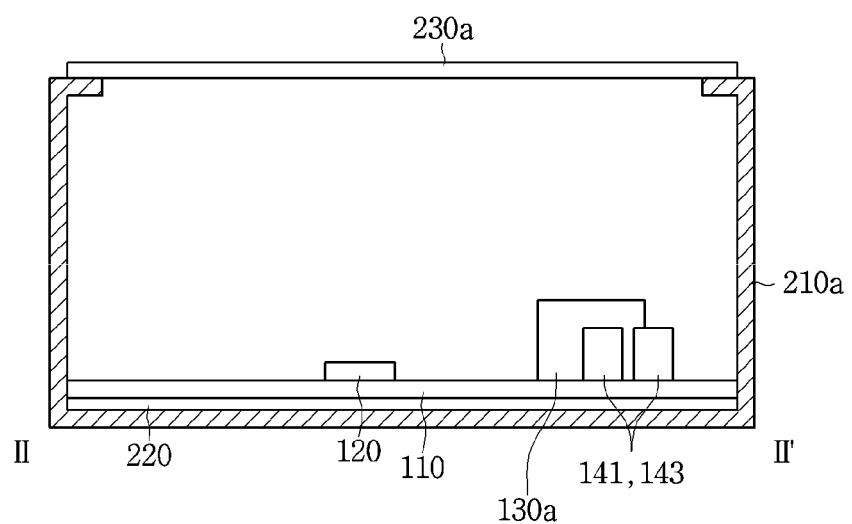

[Figure 8]
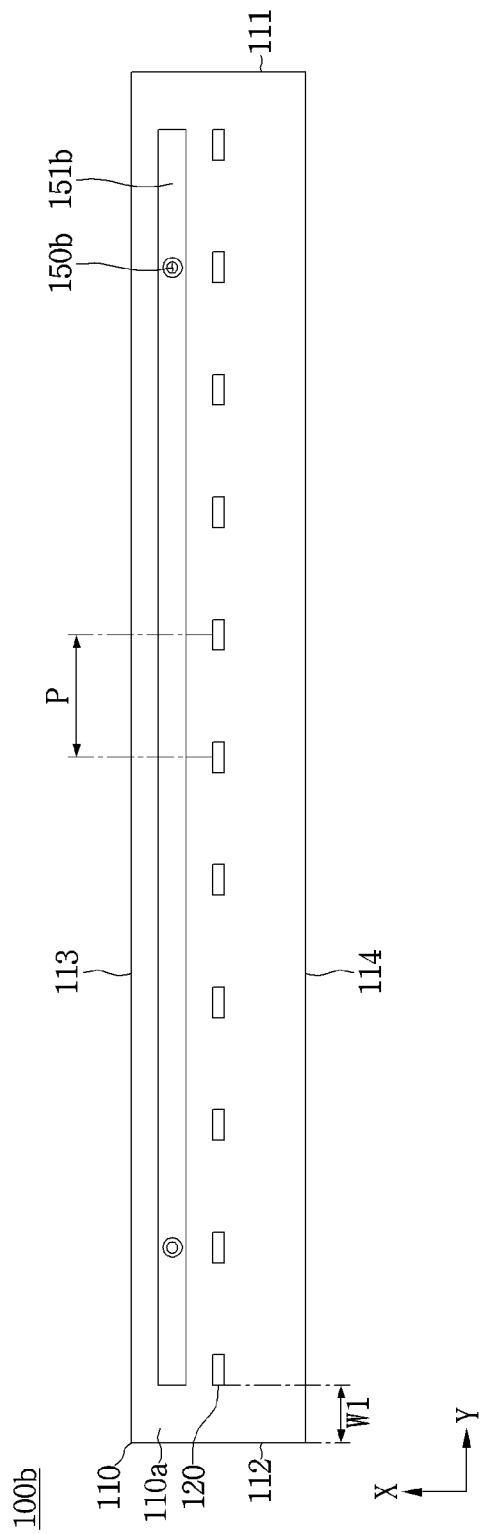

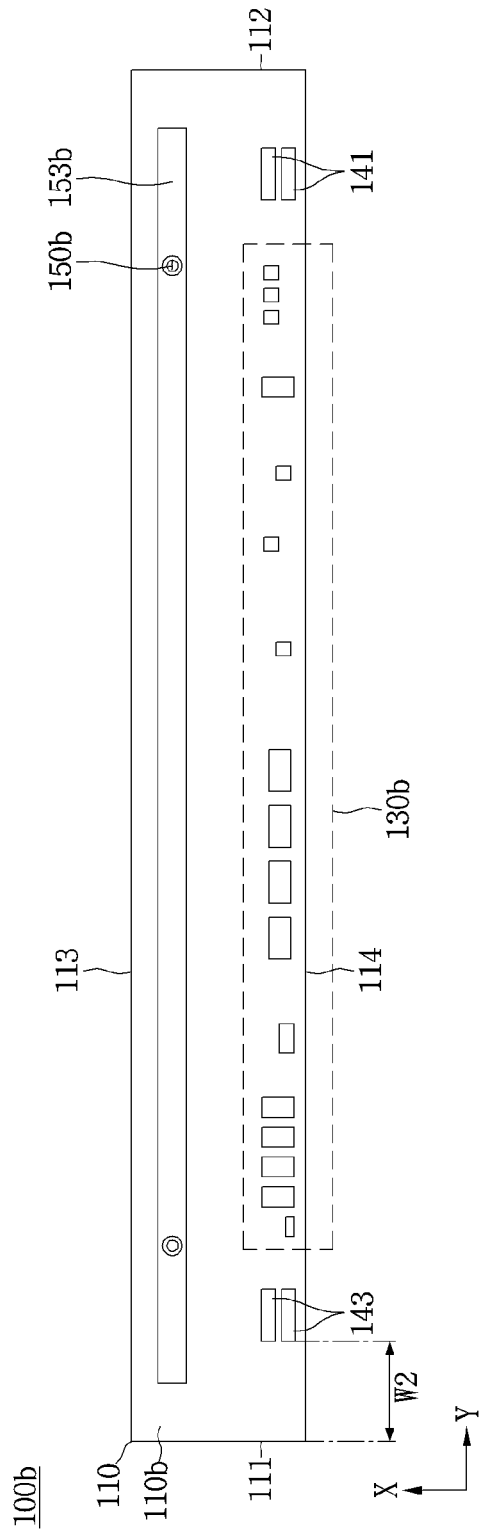
[Figure 9]

[Figure 10]
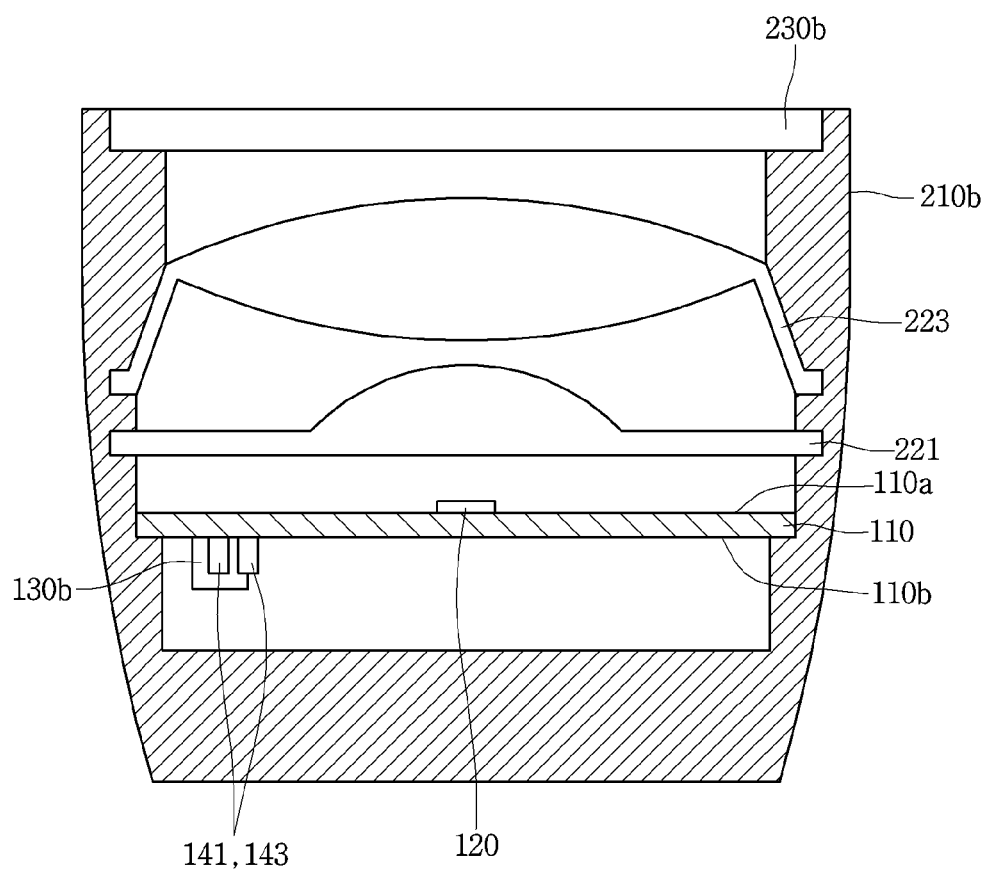

[Figure 11]
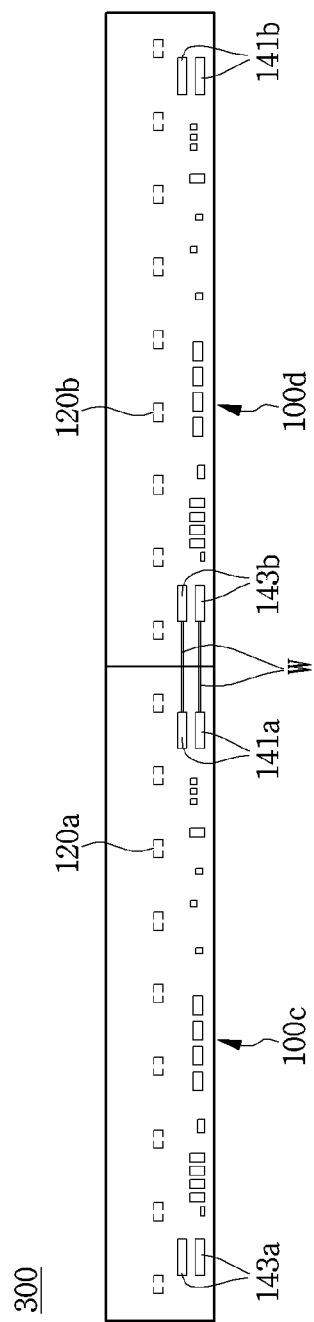

[Figure 12]
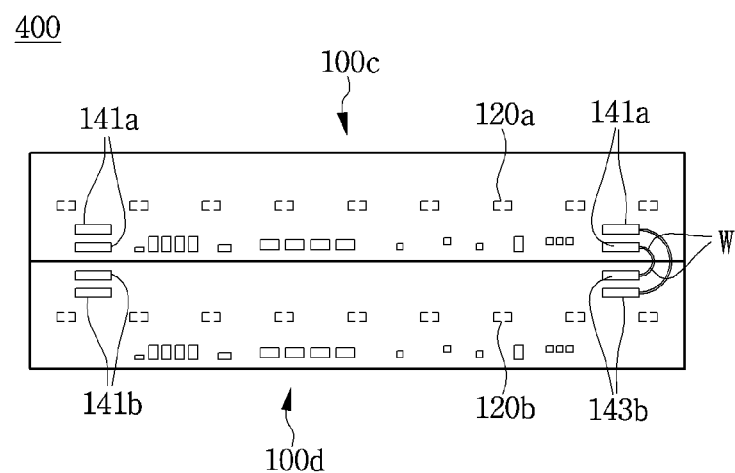

[Figure 13]
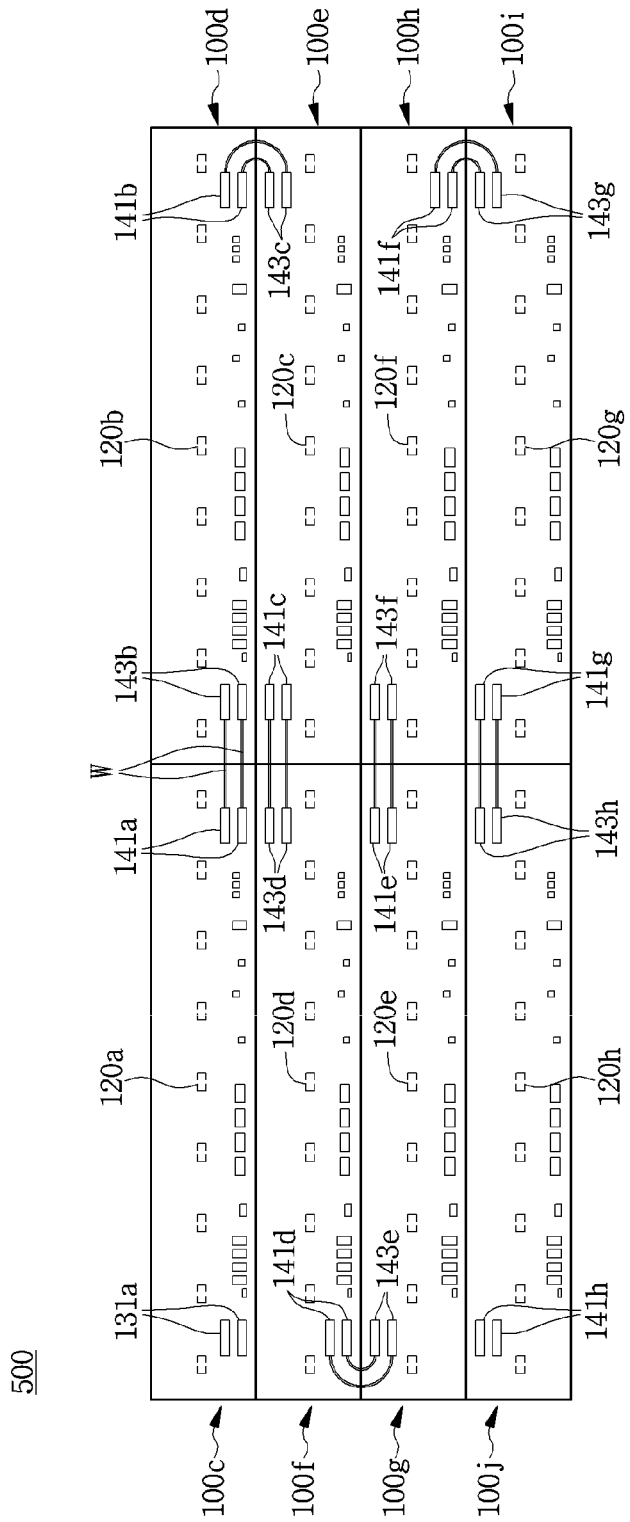

【Figure 14】
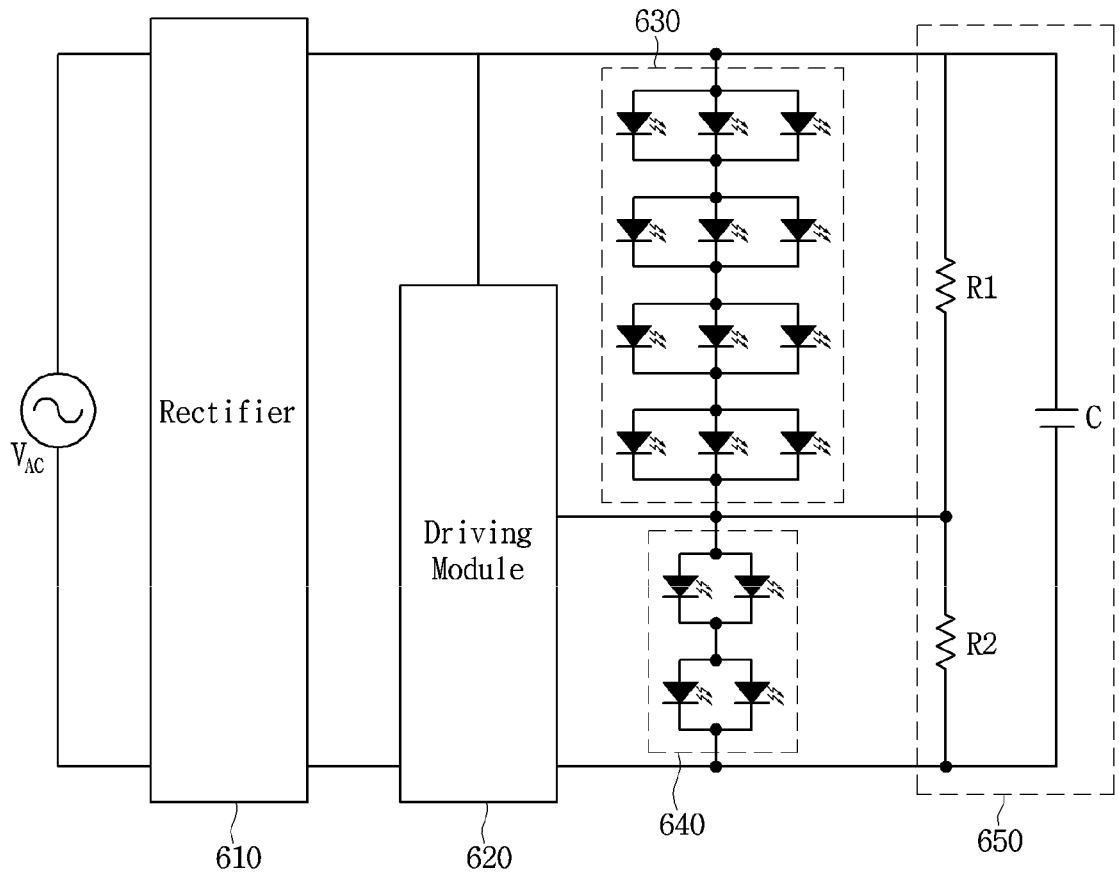
【Figure 15】
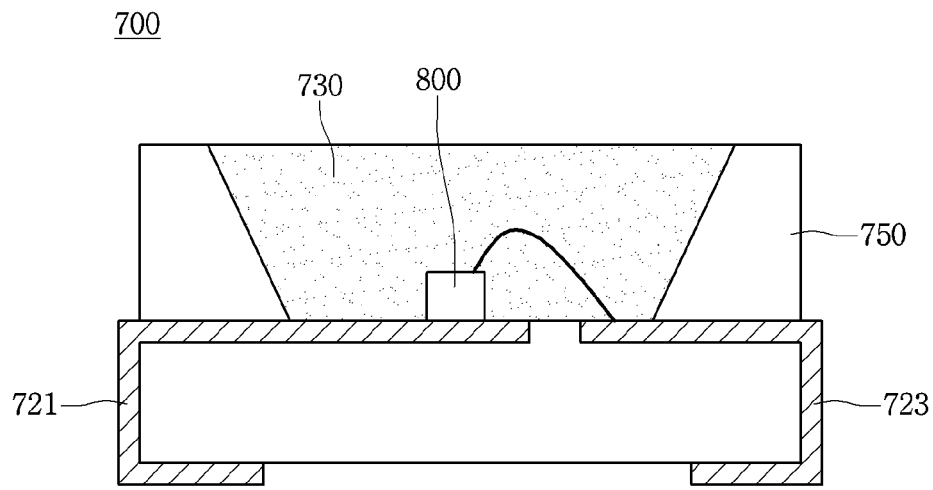

【Figure 16】
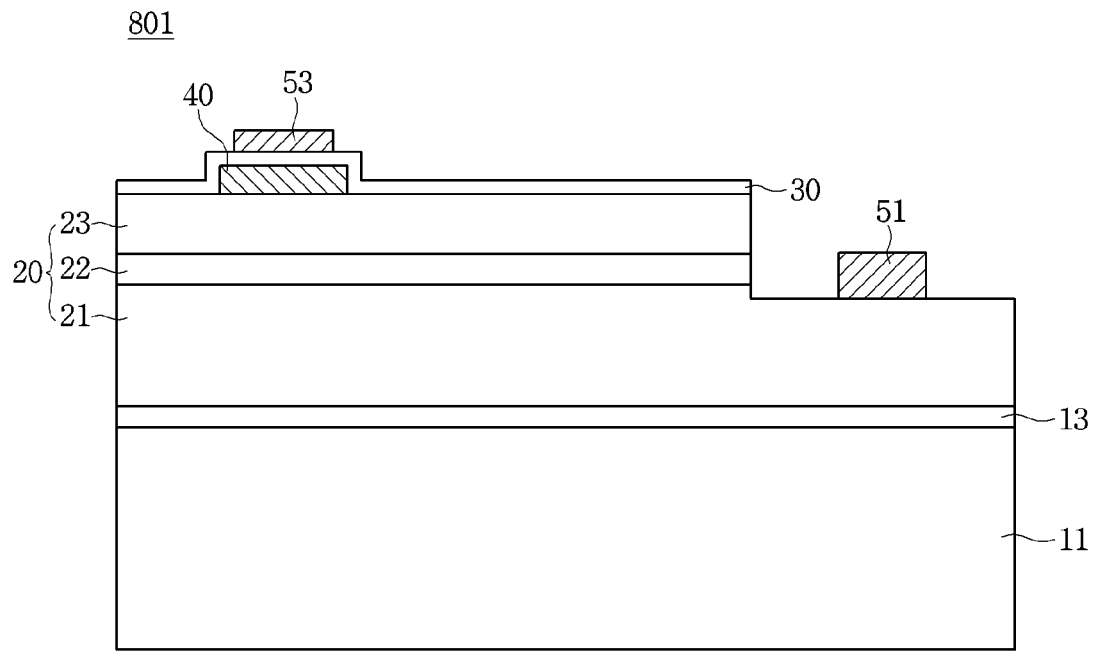
【Figure 17】
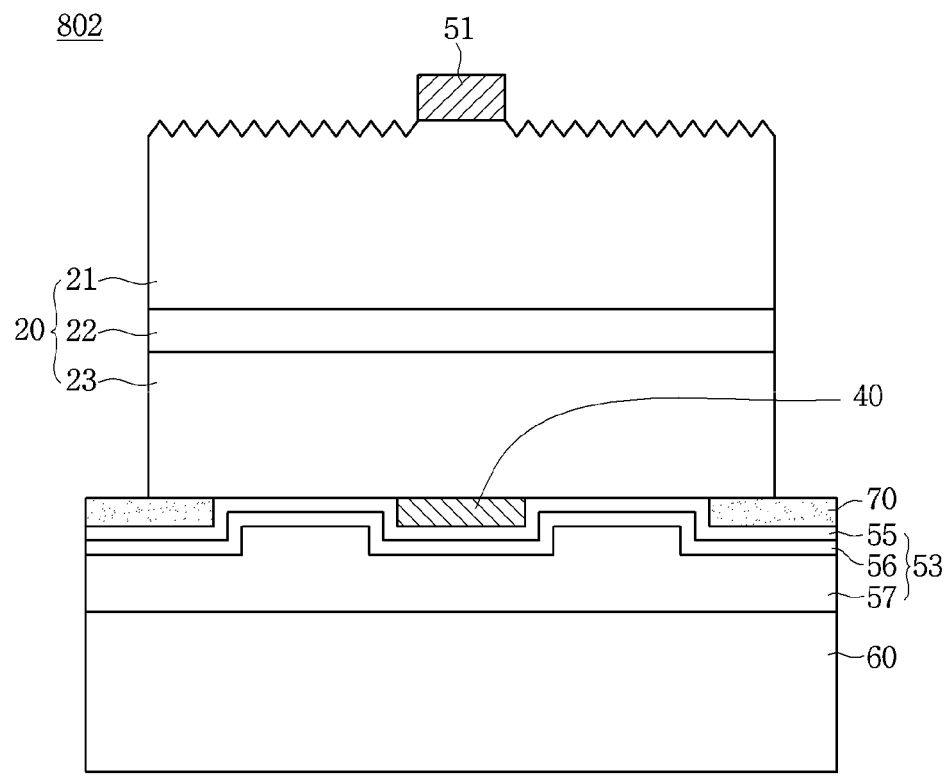

LIGHT SOURCE MODULE AND LIGHTING DEVICE

CROSS REFERENCE TO RELATED APPLICATIONS

This application is the National Phase of PCT International Application No. PCT/KR2016/000548, filed on Jan. 19, 2016, which claims priority under 35 U.S.C. 119(a) to Patent Application Nos. 10-2015-0008707, 10-2015-0010571, and 10-2015-0049710 filed in the Republic of Korea on Jan. 19, 2015, Jan. 22, 2015, and Apr. 8, 2015, respectively, all of which are hereby expressly incorporated by reference into the present application.

TECHNICAL FIELD

Embodiments relate to a light source module and light device.

BACKGROUND ART

Light emitting devices are P-N junction diodes having a characteristic where electrical energy is converted into light energy and may be formed of Group III and V compound semiconductors in the periodic table, and by adjusting a composition ratio of the compound semiconductors, it is possible to realize various colors.

GaN-based light emitting devices (LEDs) are variously applied to natural color LED display devices, LED traffic signals, white LEDs, etc. Recently, a luminous efficiency of high-efficiency white LEDs is better than an efficiency of general fluorescent lamps, and thus, the high-efficiency white LEDs are expected to replace the fluorescent lamps in the general lighting field.

A related art lighting device including a light emitting device includes a light emitting module with a light emitting device mounted thereon, a driving module which rectifies an external alternating current (AC) voltage and generates a driving signal for driving the light emitting device, and an external case.

However, in the related art lighting device, workability is reduced due to an assembly of the light emitting module and the driving module, and there is a problem where it is difficult to slim and thin the lighting device.

Moreover, since the related art lighting device has a complicated configuration, an arrangement of light emitting devices is limited, and for this reason, there is a problem where it is difficult to realize wholly uniform luminance.

DISCLOSURE

Technical Problem

Embodiments provide a light source module and a lighting device, which can be slimmed and thinned.

Embodiments provide a light source module and a lighting device, which can realize uniform luminance.

Embodiments provide a light source module and a lighting device, in which a design of arrangement of light emitting devices is free.

Technical Solution

A light source module according to an embodiment includes: a substrate; a plurality of light emitting device packages disposed on one surface of the substrate; a plurality of driving devices disposed on the one surface of the substrate; and a connection terminal part disposed on the one surface of the substrate, wherein an interval between both ends of the substrate and the connection terminal part is equal to or greater than an interval between the light emitting device package adjacent to the both ends of the substrate and the both ends of the substrate.

A lighting device according to an embodiment may include one or more the light source modules.

A light source module according to an embodiment may include a first light source module including one or more the light source modules, a second light source module including one or more the light source modules, and a connection member connecting the first and second light source modules.

A lighting device according to an embodiment may include the connection member and the first and second light source modules.

Advantageous Effects

In a light source module according to embodiments, a plurality of driving devices which generate a driving voltage for driving a plurality of light emitting device packages are mounted on the same substrate as a substrate on which the light emitting device packages are mounted, and thus, the light source module has an advantage favorable to slimming and thinning.

Moreover, in the light source module, intervals between a connection terminal part and both ends of the substrate are equal to or greater than intervals between the plurality of light emitting device packages and the both ends of the substrate, and thus, the light source module has an advantage where a design of arrangement of the light emitting device packages is free.

Moreover, a lighting device including two or more the light source modules coupled to each other has an advantage which can realize uniform flat light due to the free design of arrangement of the light emitting device packages or can control a luminance of a specific region.

Moreover, in the lighting device including the light source module, a lower surface of the substrate of the light source module directly contacts an inner bottom of a lower cover, and thus, the lighting device has an advantage which is good in heat dissipation.

DESCRIPTION OF DRAWINGS

FIG. 1 is a plan view illustrating a light source module according to a first embodiment.

FIG. 2 is a perspective view illustrating a lighting device including the light source module of FIG. 1.

FIG. 3 is a cross-sectional view illustrating a lighting device taken along line I-I' of FIG. 2.

FIG. 4 is a plan view illustrating a top of a light source module according to a second embodiment.

FIG. 5 is a plan view illustrating a rear surface of the light source module according to the second embodiment.

FIG. 6 is a perspective view illustrating a lighting device including the light source module of FIG. 4.

FIG. 7 is a cross-sectional view illustrating a lighting device taken along line II-II' of FIG. 6.

FIG. 8 is a plan view illustrating a top of a light source module according to a third embodiment.

FIG. 9 is a plan view illustrating a rear surface of the light source module according to the third embodiment.

FIG. 10 is a cross-sectional view illustrating a lighting device including the light source module of FIG. 8.

FIGS. 11 to 13 are plan views illustrating a lighting device including a plurality of light source modules coupled to each other.

FIG. 14 is a diagram illustrating a driving circuit of a light source module according to an embodiment.

FIG. 15 is a cross-sectional view illustrating a light emitting device package included in a light source module according to an embodiment.

FIGS. 16 and 17 are cross-sectional views illustrating an embodiment of a light emitting device included in the light emitting device package of FIG. 15.

MODE FOR INVENTION

Hereinafter, a light emitting device and a light emitting device package according to embodiments will be described in detail with reference the accompanying drawings. In the description of embodiments, it will be understood that when a layer (or film), region, pattern or structure is referred to as being 'on' another layer (or film), region, pad or pattern, the terminology of 'on' and 'under' includes both the meanings of 'directly' and 'indirectly'. Also, the reference about 'on' and 'under' each layer will be made on the basis of drawings.

FIG. 1 is a plan view illustrating a light source module according to a first embodiment.

Referring to FIG. 1, a light source module 100 according to the first embodiment includes a substrate 110, a plurality of light emitting device packages 120, a plurality of driving devices 130, a connection terminal part, and a wiring pattern 150.

The substrate 110 may be a bar type, and examples of the substrate 110 may include a resin-based printed circuit board (PCB), a metal core PCB, a flexible PCB, a ceramic PCB, and an FR-4 substrate.

The substrate 110 may include a printed circuit board including a metal layer provided therein. The substrate 110 includes one end 111 and another end 112 which are disposed in both ends in a lateral direction corresponding to a lengthwise direction. The substrate 110 may include one side surface 113 and another side surface 114 parallel to the lateral direction of the substrate 110.

Although not shown, a plurality of pads connected to the plurality of light emitting devices 120, the plurality of driving devices 130, and the connection terminal part may be provided on the substrate 110. Here, the pads may be electrically connected to the wiring pattern 150.

The wiring pattern 150 may be provided on one surface of the substrate 110. The wiring pattern 150 may be formed of at least one of titanium (Ti), nickel (Ni), gold (Au), chromium (Cr), tantalum (Ta), platinum (Pt), tin (Sn), silver (Ag), and phosphorus (P), or a selective alloy thereof, and may be formed a single layer or a multilayer. An insulation layer may be formed on the wiring pattern 150.

The wiring pattern 150 includes a connection pattern 151 which connects the plurality of driving devices 130 to the connection terminal part. For example, the connection pattern 151 may be disposed between the one end 111 of the substrate 110 and a light emitting device package 120 adjacent thereto.

The plurality of light emitting device packages 120 may be mounted on one surface of the substrate 110. The plurality of light emitting device packages 120 may be spaced apart from each other by a constant interval in a first direction corresponding to the lateral direction of the substrate 110.

The plurality of light emitting device packages 120 is limited to a package type light emitting device package 120, but may be a chip on substrate (COB), where a chip is directly mounted on the one surface of the substrate 110, without being limited thereto.

The plurality of light emitting device packages 120 may be arranged at constant intervals in a lateral direction corresponding to the lateral direction of the substrate 110. That is, the plurality of light emitting device packages 120 may have a constant pitch P on the substrate 110. Since the plurality of light emitting device packages 120 have the constant pitch P on the substrate 110, uniform luminance can be realized in the lateral direction of the substrate 110. An interval W1 between the light emitting device package 120 adjacent to both ends of the substrate 110 and the both ends of the substrate 110 may be ½ of the pitch P between the plurality of light emitting device packages.

In the first embodiment, the plurality of light emitting device packages 120 having the constant pitch are described with being limited, but are not specially limited. The plurality of light emitting device packages 120 may have different pitches by regions. For example, the plurality of light emitting device packages 120 may have a narrow or wide pitch toward the one end 111 or the other end 112 of the substrate 110. Also, the plurality of light emitting device packages 120 may have a pitch which is narrowed progressively closer to a center portion of the substrate 110. Also, the plurality of light emitting device packages 120 may have a pitch which is narrowed progressively closer to the both ends of the substrate 110.

The plurality of driving devices 130 may be mounted on the one surface of the substrate 110 and may be disposed adjacent to the one side surface 113 of the substrate 110 parallel to the lateral direction of the substrate 110. The plurality of driving devices 130 may be disposed between the one side surface 113 of the substrate 110 and the plurality of light emitting device packages 120, but are not limited thereto.

The connection terminal part may include a first connection terminal 141 adjacent to the one end 111 of the substrate 110 and a second connection terminal 143 adjacent to the other end 112 of the substrate 110.

The first and second connection terminals 141 and 143 may be mounted on the one surface of the substrate 110 and may be disposed adjacent to the other side surface 114 of the substrate parallel to the lateral direction of the substrate 110. The first and second connection terminals 141 and 143 may be disposed between the other side surface 114 of the substrate 110 and the plurality of light emitting device packages 120, but are not limited thereto.

The first and second connection terminals 141 and 143 may be electrically connected to each other.

The first and second connection terminals 141 and 143 may include a connector function that electrically connects an external driving power source and the light source module 100 so as to be supplied with a driving signal from the driving power source, or electrically connects a plurality of light source modules. For example, the first connection terminal 141 may be connected to the external driving power source, and the second connection terminal 143 may be connected to another light source module.

The first and second connection terminals 141 and 143 may be spaced apart from the both ends of the substrate 110 by a constant interval. An interval W2 between the first and second connection terminals 141 and 143 and the both ends of the substrate 110 may be designed equal to or greater than the interval W1 between the light emitting device package 120 adjacent to the both ends of the substrate 110 and the both ends of the substrate 110. That is, the first and second connection terminals 141 and 143 may have an interval which is farther away than or equal to the light emitting device package 120 from the both ends of the substrate 110.

The first and second connection terminals 141 and 143 are mounted in a direction parallel to the lateral direction of the substrate 110, but are not limited thereto. For example, the first and second connection terminals 141 and 143 may be mounted in a vertical direction of the substrate 110, or may be mounted as a type which is inclined between the lateral direction and the vertical direction. A type where the first and second connection terminals 141 and 143 are mounted may be changed depending on a connection structure with the external driving power source and a coupling structure with another light source module.

The first and second connection terminals 141 and 143 may be spaced apart from the plurality of light emitting device packages 120 by a constant interval. An interval between the first and second connection terminals 141 and 143 and the plurality of light emitting device packages 120 may be determined based on a full width at the half maximum (FWHM) of the light emitting device package 120.

The FWHM of the light emitting device package 120 may be changed based on a beam angle characteristic of the light emitting device package 120.

Moreover, an interval between the plurality of driving devices 130 and the plurality of light emitting device packages 120 may be determined based on the FWHM.

A distance between the plurality of driving devices 130 and the plurality of light emitting device packages 120 may be changed based on a height of each of the plurality of driving devices 130.

Moreover, a distance between the plurality of light emitting device packages 120 and the first and second connection terminals 141 and 143 may be changed based on a height of each of the plurality of driving devices 130 and the first and second connection terminals 141 and 143. For example, the FWHM of the plurality of light emitting device packages 120 may be tan 10 to 30 degrees. When the FWHM of the plurality of light emitting device packages 120 is tan 30 degrees (0.5774), a minimum interval between the plurality of driving devices 130 and the plurality of light emitting device packages 120 and a minimum interval between the first and second connection terminals 141 and 143 and the plurality of light emitting device packages 120 may be determined based on a height, and the height may be inversely proportional to the interval.

In the light source module 100 according to the first embodiment, the plurality of light emitting device packages 120, the plurality of driving devices 130, the wiring pattern 150, and the first and second connection terminals 141 and 143 may all be disposed on the one surface of the substrate 110. Therefore, in the light source module 100 according to the first embodiment, the plurality of driving devices 130 which generate a driving voltage for driving the plurality of light emitting device packages 120 are mounted on the same substrate 110 as a substrate on which the light emitting device packages 120 are mounted, and thus, the light source module 100 has an advantage favorable to slimming and thinning.

Moreover, the first and second connection terminals 141 and 143 may have an interval which is equal to or greater than the interval W1 between the plurality of light emitting device packages 120 and the both ends of the substrate 110. Due to such a structure, the light source module 100 according to the first embodiment has an advantage where a design of the light emitting device packages 120 is freer than general light source modules.

FIG. 2 is a perspective view illustrating a lighting device including the light source module of FIG. 1, and FIG. 3 is a cross-sectional view illustrating a lighting device taken along line I-I' of FIG. 2.

Referring to FIGS. 2 and 3, a lighting device 200 according to a first embodiment includes a light source module 100, a lower cover 210, and an upper cover 230.

The light source module 100 may use a technical feature of the first embodiment of FIG. 1. Therefore, the light source module 100 is the same as the first embodiment of FIG. 1. Thus, like reference numerals refer to like elements, and a detailed description is omitted. Hereinafter, features of the lower cover 210 and the upper cover 230 will be described.

The lower cover 210 accommodates the light source module 100 and the upper cover 230. The lower cover 210 may include a metal material which is good in heat dissipation. That is, the lower cover 210 may include a material which is high in thermal conductivity.

The lower cover 210 includes a first hanging groove 211, into which the upper cover 230 is accommodated in a lateral direction corresponding to a lengthwise direction, and a second hanging groove 213 into which the light source module 100 is accommodated in the lateral direction.

The first hanging groove 211 may be formed by first protrusions 212 which protrude in a direction from an inner surface of the lower cover 210 to the inside. The first protrusions 212 may extend in a lateral direction of the lower cover 210.

The lower cover 210 and the upper cover 230 may be coupled to each other in a sliding type, but are not limited thereto. That is, the upper cover 230 may be inserted into the first hanging groove 211 and may be coupled to the lower cover 210. The upper cover 230 includes a function of protecting the light source module 100 and diffusing light emitted from the light source module 100.

The second hanging groove 213 may be formed by a second protrusion 214 which is spaced apart from an inner bottom of the lower cover 210 by a constant interval in an up direction.

The second protrusion 214 may protrude in a direction toward the inside of the lower cover 210 and may extend in a lateral direction of the lower cover 210.

The lower cover 210 and the light source module 100 may be coupled to each other in a sliding type, but are not limited thereto. That is, in the light source module 100, the substrate 110 may be inserted into the second hanging groove 213 and may be coupled to the lower cover 210.

A lower surface of the substrate 110 may directly contact an inner bottom of the lower cover 210, and heat from the light source module 100 may be conducted to the lower cover 210 which is high in thermal conductivity. Accordingly, the lighting device 200 according to the first embodiment has an advantage where the lighting device 200 is good in heat dissipation as well as slimming and thinning.

In the light source module 100, the plurality of light emitting device packages 120, the plurality of driving devices 130, and the wiring pattern are all disposed on the one surface of the substrate 110, and thus, even when the lower surface of the substrate 110 formed of an insulating material directly contacts the lower cover 210 formed of a conductive material which is high in thermal conductivity, a degradation in electrical characteristic such as a short circuit of the wiring pattern can be prevented.

In the lighting device 200 according to the first embodiment, the light source module 100 where the plurality of light emitting device packages 120, the plurality of driving devices 130, the wiring pattern 150, and the first and second connection terminals 141 and 143 are all disposed on the one surface of the substrate 110 is coupled to an inner bottom of the lower cover 210 in a sliding type such that it is advantageous to slimming and thinning, and the lower surface of the substrate 110 directly contacts the inner bottom of the lower cover 210 such that it has an advantage which is good in heat dissipation.

FIG. 4 is a plan view illustrating a top of a light source module according to a second embodiment, and FIG. 5 is a plan view illustrating a rear surface of the light source module according to the second embodiment.

Referring to FIGS. 4 and 5, a light source module 100*a* according to the second embodiment may use a technical feature of the light source module of the first embodiment, except for a plurality of driving devices 130*a* and a wiring pattern 150*a*. Thus, in the first and second embodiments, like reference numerals refer to like elements, and a detailed description is omitted.

The substrate 110 may have a bar type, and examples of the substrate 110 may include a resin-based printed circuit board (PCB), a metal core PCB, a flexible PCB, a ceramic PCB, and an FR-4 substrate. The substrate 110 may include a printed circuit board including a metal layer provided therein. The substrate 110 includes one end 111 and another end 112 which are disposed in both ends in a lateral direction Y. The substrate 110 may include one side surface 113 and another side surface parallel to the lateral direction Y of the substrate 110.

Although not shown, a plurality of pads connected to the plurality of light emitting devices 120, the plurality of driving devices 130*a*, and a connection terminal part may be provided on the substrate 110. Here, the pads may be electrically connected to the wiring pattern 150*a*.

First and second hanging grooves 115 and 116 are provided in both side surfaces of the substrate 110. The first and second hanging grooves 115 and 116 include a function for alignment and coupling with a structure of a lighting device and the light source module 100*a*.

The wiring pattern 150*a* may be provided on a rear surface 110*b* of the substrate 110. The wiring pattern 150*a* may be formed of at least one of titanium (Ti), nickel (Ni), gold (Au), chromium (Cr), tantalum (Ta), platinum (Pt), tin (Sn), silver (Ag), and phosphorus (P), or a selective alloy thereof, and may be formed a single layer or a multilayer. An insulation layer may be formed on the wiring pattern 150*a*.

Although not shown, the substrate 110 may further include a contact hole which connects the wiring pattern 150*a*, the plurality of driving devices 130*a*, the plurality of light emitting device packages 120, and the connection terminal part.

The plurality of light emitting device packages 120 may be mounted on a top 110*a* of the substrate 110. The plurality of light emitting device packages 120 may be spaced apart from each other by a constant interval in a first direction corresponding to the lateral direction Y of the substrate 110. The plurality of light emitting device packages 120 is limited to a package type light emitting device package 120, but may be a chip on substrate (COB), where a chip is directly mounted on the top 110*a* of the substrate 110, without being limited thereto.

The plurality of light emitting device packages 120 may be mounted at constant intervals in the lateral direction Y of the substrate 110. That is, the plurality of light emitting device packages 120 may have a constant pitch P on the substrate 110. Since the plurality of light emitting device packages 120 have the constant pitch P on the substrate 110, uniform luminance can be realized in the lateral direction Y of the substrate 110.

An interval W1 between the light emitting device package 120 adjacent to both ends of the substrate 110 and the both ends of the substrate 110 may be ½ of the pitch P between the plurality of light emitting device packages.

In the second embodiment, the plurality of light emitting device packages 120 having the constant pitch are described with being limited, but are not specially limited. The plurality of light emitting device packages 120 may have different pitches by regions. For example, the plurality of light emitting device packages 120 may have a narrow or wide pitch toward the one end 111 or the other end 112 of the substrate 110.

Also, the plurality of light emitting device packages 120 may have a pitch which is narrowed progressively closer to a center portion of the substrate 110. Also, the plurality of light emitting device packages 120 may have a pitch which is narrowed progressively closer to the both ends of the substrate 110.

The plurality of driving devices 130*a* may be mounted on the top 110*a* of the substrate 110 and may be disposed adjacent to the one side surface 113 of the substrate 110 parallel to the lateral direction Y of the substrate 110. The plurality of driving devices 130*a* may be disposed between the one side surface 113 of the substrate 110 and the plurality of light emitting device packages 120, but are not limited thereto.

The connection terminal part may include a first connection terminal 141 adjacent to the one end 111 of the substrate 110 and a second connection terminal 143 adjacent to the other end 112 of the substrate 110. The first and second connection terminals 141 and 143 may be mounted on the top 110*a* of the substrate 110 and may be disposed adjacent to the one side surface 113 of the substrate 110 parallel to the lateral direction Y of the substrate 110. The first and second connection terminals 141 and 143 may be disposed between the one side surface 113 of the substrate 110 and the plurality of light emitting device packages 120, but are not limited thereto.

The first and second connection terminals 141 and 143 may be disposed adjacent to the plurality of driving devices 130*a*. The first and second connection terminals 141 and 143 may be spaced apart from each other with the plurality of driving devices 130*a* therebetween. The first and second connection terminals 141 and 143 may be disposed parallel to the plurality of driving devices 130*a*. The first and second connection terminals 141 and 143 may be electrically connected to each other.

The first and second connection terminals 141 and 143 may include a connector function that electrically connects an external driving power source and the light source module 100*a* so as to be supplied with a driving signal from the driving power source, or electrically connects a plurality of light source modules. For example, the first connection terminal 141 may be connected to the external driving power source, and the second connection terminal 143 may be connected to another light source module.

The first and second connection terminals 141 and 143 may be spaced apart from the both ends of the substrate 110 by a constant interval. An interval W2 between the first and second connection terminals 141 and 143 and the both ends of the substrate 110 may be designed equal to or greater than the interval W1 between the light emitting device package 120 adjacent to the both ends of the substrate 110 and the both ends of the substrate 110. That is, the first and second connection terminals 141 and 143 may have an interval which is farther away than or equal to the light emitting device package 120 from the both ends of the substrate 110.

The first and second connection terminals 141 and 143 are mounted in a direction parallel to the lateral direction Y of the substrate 110, but are not limited thereto. For example, the first and second connection terminals 141 and 143 may be mounted in a vertical direction X of the substrate 110, or may be mounted as a type which is inclined between the lateral direction and the vertical direction. A type where the first and second connection terminals 141 and 143 are mounted may be changed depending on a connection structure with the external driving power source and a coupling structure with another light source module.

The first and second connection terminals 141 and 143 may be spaced apart from the plurality of light emitting device packages 120 by a constant interval.

An interval between the first and second connection terminals 141 and 143 and the plurality of light emitting device packages 120 may be determined based on a full width at the half maximum (FWHM) of the light emitting device package 120. The FWHM of the light emitting device package 120 may be changed based on a beam angle characteristic of the light emitting device package 120.

Moreover, an interval between the plurality of driving devices 130a and the plurality of light emitting device packages 120 may be determined based on the FWHM.

A distance between the plurality of driving devices 130a and the plurality of light emitting device packages 120 may be changed based on a height of each of the plurality of driving devices 130a.

Moreover, a distance between the plurality of light emitting device packages 120 and the first and second connection terminals 141 and 143 may be changed based on a height of each of the plurality of driving devices 130a and the first and second connection terminals 141 and 143. For example, the FWHM of the plurality of light emitting device packages 120 may be tan 10 to 30 degrees. When the FWHM of the plurality of light emitting device packages 120 is tan 30 degrees (0.5774), a minimum interval between the plurality of driving devices 130a and the plurality of light emitting device packages 120 and a minimum interval between the first and second connection terminals 141 and 143 and the plurality of light emitting device packages 120 may be determined based on a height, and the height may be inversely proportional to the interval.

In the light source module 100a according to the second embodiment, the plurality of light emitting device packages 120, the plurality of driving devices 130a, and the first and second connection terminals 141 and 143 may all be disposed on the top 110a of the substrate 110. Therefore, in the light source module 100a according to an embodiment, the plurality of driving devices 130a which generate a driving voltage for driving the plurality of light emitting device packages 120 are mounted on the same substrate 110 as a substrate on which the light emitting device packages 120 are mounted, and thus, the light source module 100 has an advantage favorable to slimming and thinning.

Moreover, the first and second connection terminals 141 and 143 may have an interval which is equal to or greater than the interval W1 between the plurality of light emitting device packages 120 and the both ends of the substrate 110. Due to such a structure, the light source module 100a according to the second embodiment has an advantage where a design of the light emitting device packages 120 is freer than general light source modules.

FIG. 6 is a perspective view illustrating a lighting device including the light source module of FIG. 4, and FIG. 7 is a cross-sectional view illustrating a lighting device taken along line II-II' of FIG. 6.

Referring to FIGS. 6 and 7, a lighting device 200a may use a technical feature of the light source module of the second embodiment, except for a light source module 110a, a lower cover 210a, and an upper cover 230a. Therefore, since the light source module 100a is the same as the second embodiment of FIG. 4, like reference numerals refer to like elements, and a detailed description is omitted. Hereinafter, features of the lower cover 210a, the upper cover 230a, and a side cover 260 will be described.

The lower cover 210a accommodates the light source module 100a and the upper cover 230a. The lower cover 210a may include a metal material which is good in heat dissipation. That is, the lower cover 210a may include a material which is high in thermal conductivity.

The lower cover 210a includes a structure with an end of a side surface bent in order for the upper cover 230a to be stably positioned, but is not limited thereto. That is, the lower cover 210a may include protrusions, which protrude to the inside along an inner surface, and a structure where the upper cover 230a is accommodated into a groove formed between the protrusions.

The upper cover 230a includes a function of protecting the light source module 100a and diffusing light emitted from the light source module 100a.

The side cover 260 covers both ends of the light source module 100a. The side cover 260 is disposed on both ends of the lower cover 210a and is disposed under the upper cover 230a. The side cover 260 includes a function of fixing the light source module 100a and reflecting lights emitted from the both ends of the light source module 100a to enhance light extraction.

The side cover 260 includes a first hole 265. The first hole 265 may accommodate a fixing member 270 which couples the side cover 260, the light source module 100a, and the lower cover 210a. That is, the first hole 265 may overlap first and second coupling grooves 115 and 116 of the light source module 100a and may overlap a second hole 215 which is formed in each of both end bottoms of the lower cover 210a.

The fixing member 270 is fastened to the first hole 265, the first and second coupling grooves 115 and 116, and the second hole 215 and includes a function of coupling the side cover 260, the light source module 100a, and the lower cover 210a. The lighting device 200a of the second embodiment is described as being limited to a screw type, but is not limited thereto. That is, the fixing member 270 may be replaced with a coupling structure such as a hook type.

An insulation member 220 is disposed between the light source module 100a and the lower cover 210a. The insulation member 220 may directly contact a rear surface of the light source module 100a and may directly contact a bottom of the lower cover 210a. The insulation member 220 may insulate the bottom of the lower cover 210a from a wiring pattern 150a exposed to the rear surface of the light source module 100a.

Heat from the light source module 100a may be conducted to the lower cover 210a which is high in thermal conductivity. Accordingly, the lighting device 200a according to the second embodiment has an advantage where the lighting device 200a is good in heat dissipation as well as slimming and thinning.

In the light source module 100a, a plurality of light emitting device packages 120 and a plurality of driving devices 130 are all disposed on a top of a substrate 110, and thus, the wiring pattern 150a exposed to a bottom of the substrate 110 can prevent a degradation in electrical characteristic such as a short circuit caused by the insulation member 220.

In the lighting device 200a according to the second embodiment, the light source module 100a where the plurality of light emitting device packages 120, the plurality of driving devices 130a, and first and second connection terminals 141 and 143 are all disposed on the top of the substrate 110 is coupled to an inner bottom of the lower cover 210a with the insulation member 220 therebetween and thus is advantageous to slimming and thinning, and a lower surface of the substrate 110 is disposed adjacent to the inner bottom of the lower cover 210a with the insulation member 220 therebetween and thus has an advantage which is good in heat dissipation.

FIG. 8 is a plan view illustrating a top of a light source module according to a third embodiment, and FIG. 9 is a plan view illustrating a rear surface of the light source module according to the third embodiment.

Referring to FIGS. 8 and 9, a light source module 100b according to the third embodiment may use a technical feature of the light source module of the first embodiment, except for a plurality of driving devices 130b and first and second wiring patterns 151b and 153b. Thus, in the first and third embodiments, like reference numerals refer to like elements, and a detailed description is omitted.

The substrate 110 may have a bar type, and examples of the substrate 110 may include a resin-based printed circuit board (PCB), a metal core PCB, a flexible PCB, a ceramic PCB, and an FR-4 substrate. The substrate 110 may include a printed circuit board including a metal layer provided therein. The substrate 110 includes one end 111 and another end 112 which are disposed in both ends in a lateral direction Y. The substrate 110 may include one side surface 113 and another side surface 114 parallel to the lateral direction Y of the substrate 110.

Although not shown, a plurality of pads connected to the plurality of light emitting devices 120, the plurality of driving devices 130b, and a connection terminal part may be provided on the substrate 110. Here, the pads may be electrically connected to the first and second wiring patterns 151b and 153b.

The plurality of light emitting device packages 120 may be mounted on a top 110a of the substrate 110. The plurality of light emitting device packages 120 may be spaced apart from each other by a constant interval in a first direction corresponding to the lateral direction Y of the substrate 110. The plurality of light emitting device packages 120 is limited to a package type light emitting device package 120, but may be a chip on substrate (COB), where a chip is directly mounted on the top 110a of the substrate 110, without being limited thereto.

The plurality of light emitting device packages 120 may be mounted at constant intervals in the lateral direction Y of the substrate 110. That is, the plurality of light emitting device packages 120 may have a constant pitch P on the substrate 110. Since the plurality of light emitting device packages 120 have the constant pitch P on the substrate 110, uniform luminance can be realized in the lateral direction Y of the substrate 110.

An interval W1 between the light emitting device package 120 adjacent to both ends of the substrate 110 and the both ends of the substrate 110 may be ½ of the pitch P between the plurality of light emitting device packages.

In the third embodiment, the plurality of light emitting device packages 120 having the constant pitch are described with being limited, but are not specially limited. The plurality of light emitting device packages 120 may have different pitches by regions. For example, the plurality of light emitting device packages 120 may have a narrow or wide pitch toward the one end 111 or the other end 112 of the substrate 110.

Also, the plurality of light emitting device packages 120 may have a pitch which is narrowed progressively closer to a center portion of the substrate 110. Also, the plurality of light emitting device packages 120 may have a pitch which is narrowed progressively closer to the both ends of the substrate 110.

The first wiring pattern 151b may be provided on the top 110a of the substrate 110. The first wiring pattern 151b may be formed of at least one of titanium (Ti), nickel (Ni), gold (Au), chromium (Cr), tantalum (Ta), platinum (Pt), tin (Sn), silver (Ag), and phosphorus (P), or a selective alloy thereof, and may be formed a single layer or a multilayer. An insulation layer may be formed on the first wiring pattern 151b.

The plurality of driving devices 130b may be mounted on a rear surface 110b of the substrate 110 and may be disposed adjacent to the one side surface 113 or the other side surface 114 of the substrate 110 parallel to the lateral direction Y of the substrate 110, or may be disposed to overlap the plurality of light emitting device packages 120, but are not limited thereto.

The second wiring pattern 153b may be provided on the rear surface 110b of the substrate 110. The second wiring pattern 153b may be formed of at least one of titanium (Ti), nickel (Ni), gold (Au), chromium (Cr), tantalum (Ta), platinum (Pt), tin (Sn), silver (Ag), and phosphorus (P), or a selective alloy thereof, and may be formed a single layer or a multilayer. An insulation layer may be formed on the second wiring pattern 153b.

The substrate 110 may further include at least one contact hole 150b which electrically connects the first and second wiring patterns 151b and 153b to connect the plurality of driving devices 130b, the plurality of light emitting device packages 120, and a connection terminal part.

The connection terminal part may include a first connection terminal 141 adjacent to the one end 111 of the substrate 110 and a second connection terminal 143 adjacent to the other end 112 of the substrate 110. The first and second connection terminals 141 and 143 may be mounted on the rear surface 110b of the substrate 110, disposed adjacent to the one side surface 113 of the substrate 110 parallel to the lateral direction Y of the substrate 110, and disposed in parallel with the plurality of driving devices 130b.

Here, a position of the connection terminal part may be variously changed. For example, the connection terminal part may be disposed on the top 110a of the substrate 110 and may be spaced apart from the plurality of driving devices 130b in a vertical direction X.

The first and second connection terminals 141 and 143 of the third embodiment may be disposed adjacent to the plurality of driving devices 130b. The first and second connection terminals 141 and 143 may be spaced apart from each other with the plurality of driving devices 130b therebetween. The first and second connection terminals 141 and 143 may be disposed parallel to the plurality of driving devices 130b. The first and second connection terminals 141 and 143 may be electrically connected to each other.

The first and second connection terminals 141 and 143 may include a connector function that electrically connects an external driving power source and the light source module 100b so as to be supplied with a driving signal from the driving power source, or electrically connects a plurality of light source modules. For example, the first connection terminal 141 may be connected to the external driving power source, and the second connection terminal 143 may be connected to another light source module.

The first and second connection terminals 141 and 143 may be spaced apart from the both ends of the substrate 110 by a constant interval. An interval W2 between the first and second connection terminals 141 and 143 and the both ends of the substrate 110 may be designed equal to or greater than the interval W1 between the light emitting device package 120 adjacent to the both ends of the substrate 110 and the both ends of the substrate 110. That is, the first and second connection terminals 141 and 143 may have an interval which is farther away than or equal to the light emitting device package 120 from the both ends of the substrate 110.

The first and second connection terminals 141 and 143 are mounted in a direction parallel to the lateral direction Y of the substrate 110, but are not limited thereto. For example, the first and second connection terminals 141 and 143 may be mounted in the vertical direction X of the substrate 110, or may be mounted as a type which is inclined between the lateral direction Y and the vertical direction X. A type where the first and second connection terminals 141 and 143 are mounted may be changed depending on a connection structure with the external driving power source and a coupling structure with another light source module.

In the light source module 100b according to the third embodiment, the plurality of light emitting device packages 120 may be disposed on the top 110a of the substrate 110, and the plurality of driving devices 130b and the first and second connection terminals 141 and 143 may be disposed on the rear surface 110b of the substrate 110. Therefore, in the light source module 100b according to the third embodiment, the plurality of driving devices 130b which generate a driving voltage for driving the plurality of light emitting device packages 120 are mounted on the same substrate 110 as a substrate on which the light emitting device packages 120 are mounted, and thus, the light source module 100 has an advantage favorable to slimming and thinning.

Moreover, the first and second connection terminals 141 and 143 according to the third embodiment may have an interval which is equal to or greater than the interval W1 between the plurality of light emitting device packages 120 and the both ends of the substrate 110. Due to such a structure, the light source module 100b according to the third embodiment has an advantage where a design of the light emitting device packages 120 is freer than general light source modules in a design architecture.

FIG. 10 is a cross-sectional view illustrating a lighting device including the light source module of FIG. 8.

Referring to FIG. 10, a lighting device 200b includes a light source module, a body part 210b, an upper cover 230b, and first and second optical lenses 221 and 223. The light source module may use a technical feature of the third embodiment of FIG. 8. Therefore, since the light source module is the same as the third embodiment of FIG. 8, like reference numerals refer to like elements, and a detailed description is omitted. Hereinafter, features of the body part 210b, the upper cover 230b, and the first and second optical lenses 221 and 223 will be described.

The body part 210b accommodates the light source module, the first optical lens 221, the second optical lens 223, and the upper cover 230b. The body part 210b may include a metal material which is good in heat dissipation. That is, the body part 210a may be formed of a material which is high in thermal conductivity.

The body part 210b may have a structure with an upper surface opened and may include a step height structure which is provided along an edge of the upper surface in order for the upper cover 230b to be stably positioned, but is not limited thereto. That is, the body part 210b may include a groove which is provided along an inner side of the upper surface. The body part 210b may include one or more protrusions which are provided along an inner surface. A groove formed by the one or more protrusions formed on the inner surface may accommodate the first and second optical lenses 221 and 223.

The upper cover 230b includes a function of protecting the light source module and the first and second optical lenses 221 and 223 and diffusing light emitted from the light source module.

The first and second optical modules 221 and 223 may include a function of diffusing, condensing, or wavelength-changing the light emitted from the light source module. The lighting device 200b of the third embodiment is described with configurations of the first and second optical lenses 221 and 223 being limited, but a number and a position may be changed.

Although not shown, the lighting device 200b of the third embodiment further includes a fixing member (not shown) which couples the body part 210b, the light source module, the upper cover 230b, and the first and second optical lenses 221 and 223, and the fixing member may be a screw type, a hook type, or the like, but is not limited thereto.

In the lighting device 200b of the third embodiment, heat from the light source module may be directly conducted to the body part 210b which is high in thermal conductivity. Therefore, the lighting device 200b of the third embodiment has an advantage where the lighting device 200b is good in heat dissipation as well as slimming and thinning.

In the light source module, a plurality of light emitting device packages 120 are disposed on a top 110a of a substrate 110, and a plurality of driving devices 130b and first and second connection terminals 141 and 143 are disposed on a rear surface 110b of the substrate 110. The light source module has an advantage where a design of elements mounted on the substrate 110 is free.

FIGS. 11 to 13 are plan views illustrating a lighting device including a plurality of light source modules coupled to each other.

Referring to FIG. 11, a lighting device 300 of a fourth embodiment includes first and second light source modules 100c and 100d.

The first and second light source modules 100c and 100d may use the technical features of the first to third embodiments of FIGS. 1, 4, 5, 8, and 9.

The first light source module 100c includes a plurality of first light emitting device packages 120a and first and second connection terminals 141a and 143a, and the second light source module 100d includes a plurality of second light emitting device packages 120b and third and fourth connection terminals 141b and 143b.

The first connection terminal 141a may be connected to the fourth connection terminal 143b by a connection member. For example, the connection member may be a wire W, but is not limited thereto.

That is, the first and second light source modules 100c and 100d are disposed in a lateral direction, and the first and fourth connection terminals 141a and 143b are electrically connected to each other, thereby providing one lighting device 300.

The first and second light emitting device packages 120a and 120b may have a constant pitch. The plurality of first and second light emitting device packages 120a and 120b have a constant pitch in the lateral direction of the first and second light source modules 100c and 100d, thereby realizing uniform luminance in the lateral direction of the first and second light source modules 100c and 100d.

In an embodiment, the first and second light emitting device packages 120a and 120b having a constant pitch are described, but are not limited thereto. The plurality of first and second light emitting device packages 120a and 120b may have different pitches by regions depending on usability.

Referring to FIG. 5, a fifth lighting device 400 includes first and second light source modules 100c and 100d.

The first and second light source modules 100c and 100d may use the technical features of the first to third embodiments of FIGS. 1, 4, 5, 8, and 9.

The first light source module 100c includes a plurality of first light emitting device packages 120a and first and second connection terminals 141a and 143a, and the second light source module 100d includes a plurality of second light emitting device packages 120b and third and fourth connection terminals 141b and 143b.

The first connection terminal 141a may be connected to the fourth connection terminal 143b by a wire W.

That is, the first and second light source modules 100c and 100d are disposed in a lateral direction, and the first and fourth connection terminals 141a and 143b are electrically connected to each other, thereby providing one lighting device 400.

The first and second light emitting device packages 120a and 120b may have a constant pitch. The plurality of first and second light emitting device packages 120a and 120b have a constant pitch in a lateral direction and a vertical direction of the first and second light source modules 100c and 100d, and thus, the lighting device 400 can realize uniform luminance in a whole region.

In an embodiment, the first and second light emitting device packages 120a and 120b having a constant pitch are described, but are not limited thereto. The plurality of first and second light emitting device packages 120a and 120b may have different pitches by regions depending on usability.

Referring to FIG. 6, a sixth lighting device 500 includes first to eighth light source modules 100c to 100j.

The first to eighth light source modules 100c to 100j may use the technical features of the first to third embodiments of FIGS. 1, 4, 5, 8, and 9.

The first light source module 100c includes a plurality of first light emitting device packages 120a and first and second connection terminals 141a and 143a, and the second light source module 100d includes a plurality of second light emitting device packages 120b and third and fourth connection terminals 141b and 143b.

The third light source module 100e includes a plurality of third light emitting device packages 120c and fifth and sixth connection terminals 141c and 143c, and the fourth light source module 100f includes a plurality of fourth light emitting device packages 120d and seventh and eighth connection terminals 141d and 143d.

The fifth light source module 100g includes a plurality of fifth light emitting device packages 120e and ninth and tenth connection terminals 141e and 143e, and the sixth light source module 100h includes a plurality of sixth light emitting device packages 120f and eleventh and twelfth connection terminals 141f and 143f.

The seventh light source module 100i includes a plurality of seventh light emitting device packages 120g and thirteenth and fourteenth connection terminals 141g and 143g, and the eighth light source module 100j includes a plurality of eighth light emitting device packages 120h and fifteenth and sixteenth connection terminals 141h and 143h.

The first connection terminal 141a may be connected to the fourth connection terminal 143b by a wire W.

The third connection terminal 141b may be connected to the sixth connection terminal 143b.

The fifth connection terminal 141c may be connected to the eighth connection terminal 143d.

The seventh connection terminal 141d may be connected to the tenth connection terminal 143e.

The ninth connection terminal 141e may be connected to the twelfth connection terminal 143f.

The eleventh connection terminal 141f may be connected to the fourteenth connection terminal 143g.

The thirteenth connection terminal 141g may be connected to the sixteenth connection terminal 143h.

That is, the first to eighth light source modules 100c to 100j are disposed in a lateral direction and a vertical direction, and the first, third to fourteenth, and sixteenth connection terminals 141a, 141b to 143g, and 143h are electrically connected to each other, thereby providing one lighting device 500.

The fourth light source module 100f and the sixth light source module 100h include the seventh, eighth, eleventh, and twelfth connection terminals 141d, 143d, 141f, and 143f disposed in a symmetric direction. In the lighting device 500 of an embodiment, positions of the seventh, eighth, eleventh, and twelfth connection terminals 141d, 143d, 14f, and 143f may be changed based on a position at which the first to eighth light source modules 100c to 100j are coupled.

The first to eighth light emitting device packages 120a to 120h may have a constant pitch. The plurality of first to eighth light emitting device packages 120a to 120h have a constant pitch in a lateral direction and a vertical direction of the first to eighth light source modules 100c to 100j. Therefore, the lighting device 500 has an advantage where the lighting device 500 provides large-screen uniform flat light like large-screen display devices.

In an embodiment, the first to eighth light emitting device packages 120a to 120h having a constant pitch are described, but are not limited thereto. The plurality of first to eighth light emitting device packages 120a to 120h may have different pitches by regions depending on usability.

The lighting devices 300, 400, and 500 according to FIGS. 11 to 13 have an advantage where various types of flat lights are provided by using one or more light source modules.

FIG. 14 is a diagram illustrating a driving circuit of a light source module according to an embodiment.

FIG. 14 is a diagram illustrating a driving circuit of a light source module according to an embodiment.

Referring to FIG. 14, a driving circuit 600 of a light source module according to an embodiment includes an alternating current (AC) power source VAC, a rectifier 610, a driving module 620, and first and second light emitting groups 630 and 640.

The first and second light emitting groups 630 and 640 may be a light source module including a plurality of light emitting device packages. That is, the first and second light emitting groups 630 and 640 may use the technical feature of the light source module of FIG. 1.

In the driving circuit 600 of the light source module, the first and light emitting groups 630 and 640 are described as an embodiment, but are not limited thereto. Therefore, the light emitting group may be provided as three or more. The first and second light emitting groups 630 and 640 may respectively have different forward voltage levels. For example, if the first and second light emitting groups 630 and 640 respectively include a different number of light emitting devices, the first and second light emitting groups 630 and 640 may have different forward voltage levels.

The rectifier 610 rectifies an AC voltage from the AC power source VAC to generate a driving voltage and outputs the generated driving voltage. The rectifier 610 is not specially limited, and one of various rectifier circuits such as a full-wave rectifier circuit and a half-wave rectifier circuit may be used. For example, the rectifier 610 may be a bridge full-wave rectifier circuit configured with four diodes.

The driving module 620 controls the first and second light emitting groups 630 and 640 by using the driving voltage. The driving module 620 may sequentially drive the first and second light emitting groups 630 and 640 during a plurality of periods. For example, the driving module 620 of an embodiment may sequentially drive the first and second light emitting groups 630 and 640 during first and second driving periods where the first and second light emitting groups 630 and 640 are sequentially driven.

In detail, the first period may be defined as a period where the driving voltage input from the rectifier 610 is supplied at a voltage level between a first forward voltage level and a second forward voltage level. Here, the second forward voltage level is higher than the first forward voltage level. The driving module 620 controls in order for the first light emitting group 630 to be driven during the first driving period.

The second period may be defined as a period where the driving voltage input from the rectifier 610 is supplied at a voltage level between the second forward voltage level and a third forward voltage level. Here, the third forward voltage level is higher than the second forward voltage level. The driving module 620 controls in order for the first and second light emitting groups 630 and 640 to be driven during the second driving period.

The driving circuit 600 of the light source module of an embodiment includes a flicker compensator 650.

The flicker compensator 650 includes a function for removing flicker which occurs in sequential driving. The flicker compensator 650 includes a capacitor C and first and second resistors R1 and R2, but is not limited thereto.

The flicker compensator 650 may be connected to the first and second light emitting groups 630 and 640 in parallel. The flicker compensator 650 may be charged with an electric charge at the first forward voltage level or more and may discharge the charged electric charge at the first forward voltage level or less. Here, for convenience of description, a period where a driving voltage having the first forward voltage level or less is supplied is defined as a third period. The driving circuit 600 of the light source module of an embodiment may drive the first and second light emitting groups 630 and 640 by using an electric charge charged in the capacitor C during a period corresponding to the first forward voltage level or less. Therefore, the flicker compensator 650 drives the first and second light emitting groups 630 and 640 during the third period to remove an off period of the light source module, thereby reducing flickers.

FIG. 15 is a cross-sectional view illustrating a light emitting device package included in a light source module according to an embodiment.

Referring to FIG. 15, a light emitting device package 700 includes a body 750, a first lead electrode 721 and a second lead electrode 723 of which at least a portion is disposed in the body 750, a light emitting device 800 electrically connected to the first lead electrode 721 and the second lead electrode 723 on the body 750, and a molding member 730 surrounding the light emitting device 800 on the body 750.

The body 750 may include silicon, synthetic resin, or a metal material.

The first lead electrode 721 and the second lead electrode 723 may be electrically disconnected from each other and may pass through the inside of the body 750. That is, a portion of each of the first lead electrode 721 and the second lead electrode 723 may be disposed in a cavity, and the other portion may be disposed outside the body 750.

The first lead electrode 721 and the second lead electrode 723 may supply power to the light emitting device 800 and may reflect light emitted from the light emitting device 800 to increase luminous efficiency, and may dissipate heat, occurring in the light emitting device 800, to the outside.

The light emitting device package 700 may be applied to a light unit. The light unit may include a structure where a plurality of light emitting devices or light emitting device packages are arrayed, and may include a light, a signal lamp, an electronic sign substrate.

FIGS. 16 and 17 are cross-sectional views illustrating an embodiment of a light emitting device included in the light emitting device package of FIG. 15.

Referring to FIG. 16, a light emitting device 801 of an embodiment has a horizontal type and includes a substrate 11, a buffer layer 13, a light emitting structure 20, an electrode layer 30, a first electrode pad 51, a second electrode pad 53, and a current blocking layer 40.

The substrate 11 is a growth substrate for growing a nitride gallium-based semiconductor layer and may use a transmissive, insulative, or conductive substrate, and for example, may use one of sapphire ($Al_2O_3$), SiC, Si, GaAs, GaN, ZnO, Si, GaP, InP, Ge, $Ga_2O_3$, $LiGaO_3$, and quartz. A plurality of protrusions may be provided on a top of the substrate 11, and the plurality of protrusions may be formed by etching the substrate 11 or may be formed in a light extraction structure such as a separate roughness. The protrusion may include a stripe shape, a hemispherical shape, or a dome shape. The buffer layer 13 may be disposed on the substrate 11 and may be formed for reducing a lattice constant difference between the substrate 11 and a nitride-based semiconductor layer, and may perform a defect control layer function. The buffer layer 13 may have a value between a lattice constant of the substrate 11 and a lattice constant of the nitride-based semiconductor layer. The buffer layer 13 may be formed of oxide such as a ZnO layer, but is not limited thereto.

The light emitting structure 20 is disposed on the substrate 11. The light emitting structure 20 includes a first conductive semiconductor layer 21, an active layer 22, and a second conductive semiconductor layer 23.

The first conductive semiconductor layer 21 may be formed of a single layer or a multilayer. When the first conductive semiconductor layer 21 is an N-type semiconductor layer, the first conductive semiconductor layer 21 may be Groups 3-5 compound semiconductor with a first conductive dopant doped thereon. The first conductive dopant is an N-type dopant and may include Si, Ge, Sn, Se, and Te, but is not limited thereto. The first conductive semiconductor layer 21 may include a semiconductor material having a composition equation of $In_xAl_yGa_{1-x-y}N$ ($0 \leq x \leq 1$, $0 \leq y \leq 1$, $0 \leq x+y \leq 1$). The first conductive semiconductor layer 21 may be formed of one or more of GaN, InN, AlN, InGaN, AlGaN, InAlGaN, AlInN, AlGaAs, InGaAs, AlInGaAs, GaP, AlGaP, InGaP, AlInGaP, and InP.

The active layer 22 may have one of a single quantum well structure, a multi-quantum well (MQW) structure, a quantum-wire structure, and a quantum dot structure. The active layer 22 may include a barrier layer and a well layer formed of a nitride gallium-based semiconductor layer.

For example, the active layer 22 may be formed in a paired structure of one or more of InGaN/GaN, InGaN/InGaN, GaN/AlGaN, InAlGaN/GaN, GaAs/AlGaAs, InGaAs/AlGaAs, GaInP/AlGaInP, GaP/AlGaP, and InGaP/AlGaP, but is not limited thereto. The well layer may be formed of a material having a band gap which is lower than a band gap of the barrier layer.

The barrier layer and the well layer of the active layer 22 may be formed of an impurity-undoped undoped layer for enhancing the crystalline quality of the active layer, but impurities may be doped on a portion or a whole active region for lowering a forward voltage.

The second conductive semiconductor layer 23 may be disposed on the active layer 22 and may be formed of a single layer or a multilayer. When the second conductive semiconductor layer 23 is a P-type semiconductor layer, the second conductive semiconductor layer 23 may be Groups 3-5 compound semiconductor with a second conductive dopant doped thereon. The second conductive dopant is a P-type dopant and may include Mg, Zn, Ca, Sr, and Ba, but is not limited thereto. The second conductive semiconductor layer 23 may be formed of, for example, one of compound semiconductors of GaN, AlN, AlGaN, InGaN, InN, InAlGaN, AlInN, AlGaAs, GaP, GaAs, GaAsP, AlGaInP, and GaP.

The first electrode pad 51 is disposed on the first conductive semiconductor layer 21.

The second electrode pad 53 is disposed on the second conductive semiconductor layer 23.

The first electrode pad 51 and the second electrode pad 53 may be selected from among Ti, Ru, Rh, Ir, Mg, Zn, Al, In, Ta, Pd, Co, Ni, Si, Ge, Ag, and Au and a selective alloy thereof.

The electrode layer 30, a current diffusion layer, may be formed of a material having transmissivity and electric conductivity. The electrode layer 30 may be formed to have a refractive index which is lower than a refractive index of a compound semiconductor layer. The electrode layer 30 may be formed on the second conductive semiconductor layer 23 and may contact the second conductive semiconductor layer 23. The electrode layer 30 may be transparent conductive oxide or a transparent metal layer. For example, the electrode layer 30 may be selected from among indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), ZnO, IrOx, RuOx, NiO, etc., and may be formed of at least one layer.

The current blocking layer 40 overlaps the second electrode pad 53 and has a function of preventing a current from being concentrated on a portion under the second electrode pad 53.

The current blocking layer 40 may be formed of, for example, an insulating material such as oxide, nitride, or the like. For example, the current blocking layer 40 may be formed of at least one material selected from the group consisting of SixOy, SixNy, SiOxNy, $Al_2O_3$, $TiO_2$, and AlN, but is not limited thereto. Alternatively, the current blocking layer 40 may include a distributed bragg reflector (DBR) where layers having different refractive indexes are alternately stacked, but is not limited thereto.

Referring to FIG. 17, a light emitting device 802 according to another embodiment has a vertical type and includes a light emitting structure 20, a first electrode pad 51 disposed on the light emitting structure 20, a second electrode pad 53 disposed under the light emitting structure 20, a current blocking layer 40 which is disposed between the light emitting structure 20 and the second electrode 53 and corresponds to the first electrode 51 in a vertical direction, and a supporting member 60.

The light emitting structure 20 is disposed on a substrate 11. The light emitting structure 20 includes a first conductive semiconductor layer 21, an active layer 22, and a second conductive semiconductor layer 23.

The second electrode pad 53 may include a contact layer 55, a reflective layer 56, and a bonding layer 57 which are disposed under the second conductive semiconductor layer 23 of the light emitting structure 20.

The contact layer 55 may contact a lower surface of the second conductive semiconductor layer 23, and a portion may extend to a lower surface of the current blocking layer 40. The contact layer 55 may use a conductive material, such as ITO, IZO, IZTO, IAZO, IGZO, IGTO, AZO, ATO, or the like, or a metal such as Ni or Ag.

The reflective layer 56 may be formed under the contact layer 55, and the reflective layer 56 may be formed in a structure including at least one layer formed of a material selected from the group consisting of Ag, Ni, Al, Rh, Pd, Ir, Ru, Mg, Zn, Pt, Au, and Hf or a combination thereof. The reflective layer 56 may contact a bottom of the second conductive semiconductor layer 23, ohmic-contact with metal, or ohmic-contact with a conductive material such as ITO, but is not limited thereto.

The bonding layer 57 may be formed under the reflective layer 56 and may be used as a barrier metal or a bonding metal, and a material thereof may include, for example, at least one of Ti, Au, Sn, Ni, Cr, Ga, In, Bi, Cu, Ag, and Ta and a selective alloy thereof.

A channel layer 70 may be disposed under the light emitting structure 20. The channel layer 70 may be formed along an edge of a lower surface of the second conductive semiconductor layer 23 and may be formed in a ring shape, a loop shape, or a frame shape. The channel layer 70 may include at least one of ITO, IZO, IZTO, IAZO, IGZO, IGTO, AZO, ATO, $SiO_2$, SiOx, SiOxNy, $Si_3N_4$, $Al_2O_3$, and $TiO_2$. An inner portion of the channel layer 70 may be disposed under the second conductive semiconductor layer 23, and an outer portion may be disposed more outward than a side surface of the light emitting structure 20.

The supporting member 60 may be provided under the bonding layer 57 and may be formed of a conductive member, and a material thereof may be formed of a conductive material such as copper (Cu), gold (Au), nickel (Ni), molybdenum (Mo), copper-tungsten (Cu—W), and carrier wafer (for example: Si, Ge, GaAs, ZnO, SiC, etc.).

The supporting member 60 may be implemented with a conductive sheet as another example. The second electrode pad 53 may include the supporting member 63, and a plurality of layers or at least one of layers of the second electrode pad 53 may be formed to have the same width as that of the supporting member 60.

A light extraction structure such as a roughness may be formed on an upper surface of the first conductive semiconductor layer 21. The first electrode pad 51 may be disposed on a planar surface of a top of the first conductive semiconductor layer 21, but is not limited thereto. An insulation layer (not shown) may be further formed on a side surface and a top of the light emitting structure 20, but is not limited thereto.

The current blocking layer 40 overlaps the first electrode pad 51 and has a function of preventing a current from concentrating on a portion under the second electrode pad 53.

The current blocking layer 40 may be formed of, for example, an insulating material such as oxide, nitride, or the like. For example, the current blocking layer 40 may be formed of at least one material selected from the group consisting of SixOy, SixNy, SiOxNy, $Al_2O_3$, $TiO_2$, and AlN, but is not limited thereto. Alternatively, the current blocking layer 40 may include a distributed bragg reflector (DBR) where layers having different refractive indexes are alternately stacked, but is not limited thereto.

The light emitting devices 801 and 802 are described as the horizontal type and the vertical type, but are not limited thereto. The light emitting devices 801 and 802 may include a flip type where an electrode pad is disposed in only a lower portion.

The features, the structures, and the effects described above in the embodiments are included in at least one embodiment, but are not limited to only one embodiment. Furthermore, in other embodiments, the features, the structures, and the effects described above in each embodiment may be combined or modified and embodied by those skilled in the art. Therefore, it should be construed that details associated with the combination or modification are in a scope of an embodiment.

The invention claimed is:

1. A light source module comprising:
   a substrate;
   a plurality of light emitting device packages on the substrate;
   a plurality of driving devices on the substrate; and
   a connection terminal part on the substrate,
   wherein an interval between both ends of the substrate and the connection terminal part is equal to or greater than an interval between the light emitting device package adjacent to the both ends of the substrate and the both ends of the substrate, and
   wherein an interval between the driving device and the light emitting device package is inversely changed according to a height of the driving device.

2. The light source module of claim 1, wherein the plurality of light emitting device packages, the plurality of driving devices, and the connection terminal part are disposed on a top of the substrate.

3. The light source module of claim 1, further comprising a wiring pattern electrically connected to the plurality of driving devices, the plurality of light emitting device packages, and the connection terminal part and disposed on a top of the substrate.

4. The light source module of claim 1, wherein the connection terminal part comprises a first connection terminal spaced apart from one end of the substrate and a second connection terminal spaced apart from another end of the substrate.

5. The light source module of claim 1, wherein the interval between the light emitting device package adjacent to the both ends of the substrate and the both ends of the substrate has a length corresponding to ½ of a pitch, the pitch being a distance between the plurality of light emitting device packages.

6. A lighting device comprising the light source module of claim 1.

7. The lighting device of claim 6, comprising a lower cover accommodating the light source module and an upper cover covering the lower cover,
   wherein the lower cover comprises:
      first protrusions protruding in a direction from an inner surface to the inside;
      a first hanging groove formed by the first protrusions and coupled to the upper cover in a sliding type;
      a second protrusion spaced apart from an inner bottom of the lower cover by a constant interval to protrude in a direction from the inner surface to the inside; and
      a second hanging groove formed between the bottom and the second protrusion and coupled to the light source module in a sliding type, and
   a lower surface of the substrate directly contacting the bottom of the lower cover.

8. The lighting device of claim 6, comprising:
   an insulation member between the light source module and the lower cover; and
   a side cover covering both ends of the light source module, in both ends of the lower cover,
   wherein the side cover comprises a first hole into which a fixing member is inserted, the bottom of the lower cover comprises a second hole corresponding to the first hole, and the first and second hanging grooves of the light source module overlap the first and second holes, respectively.

9. The lighting device of claim 6, comprising:
   a body part accommodating the light source module, a top of the body part being opened;
   an upper cover covering a top of the body part; and
   one or more optical lenses on the light source module.

10. A lighting device comprising:
    a first light source module of claim 1;
    a second light source module of claim 1; and
    a connection member connecting the first light source module and the second light source module.

11. The lighting device of claim 10, wherein the first and second light source modules are connected to each other in a lateral direction or a vertical direction.

12. The lighting device of claim 10, wherein
    the first light source module is provided in plurality,
    the second light source module is provided in plurality, and
    the first and second light source modules are connected to each other in a lateral direction and a vertical direction.

13. The light source module of claim 3, wherein the wiring pattern includes a connection pattern disposed between an end of the substrate and a light emitting device package adjacent thereto.

14. The light source module of claim 4, wherein the first and second connection terminals are spaced apart from both ends of the substrate.

* * * * *